United States Patent
Sung et al.

(10) Patent No.: US 12,009,814 B2
(45) Date of Patent: Jun. 11, 2024

(54) LEVEL SHIFTER WITH LOW PROPAGATION DELAY

(71) Applicant: SigmaStar Technology Ltd., Fujian (CN)

(72) Inventors: Chao-Chun Sung, Hsinchu (CN); Che-Lun Hsu, Hsinchu (CN); Chang-Han Li, Hsinchu (CN)

(73) Assignee: SIGMASTAR TECHNOLOGY LTD., Fujian (CN)

( * ) Notice: Subject to any disclaimer, the term of this patent is extended or adjusted under 35 U.S.C. 154(b) by 0 days.

(21) Appl. No.: 18/084,799

(22) Filed: Dec. 20, 2022

(65) Prior Publication Data

US 2023/0308101 A1 Sep. 28, 2023

(30) Foreign Application Priority Data

Mar. 25, 2022 (CN) .......................... 202210307108.X

(51) Int. Cl.
| | |
|---|---|
| *H03K 19/0175* | (2006.01) |
| *H03K 19/017* | (2006.01) |
| *H03K 19/0185* | (2006.01) |
| *H03K 19/173* | (2006.01) |
| *H03K 19/20* | (2006.01) |

(52) U.S. Cl.
CPC ... *H03K 19/017* (2013.01); *H03K 19/018507* (2013.01); *H03K 19/1737* (2013.01); *H03K 19/20* (2013.01)

(58) Field of Classification Search
CPC combination set(s) only.
See application file for complete search history.

(56) References Cited

U.S. PATENT DOCUMENTS

| | | | |
|---|---|---|---|
| 11,152,937 B2 * | 10/2021 | Lin ........................ | H03K 3/356 |
| 2015/0180474 A1 * | 6/2015 | Mathur .......... | H03K 19/018521 |
| | | | 326/81 |

* cited by examiner

*Primary Examiner* — Long Nguyen
(74) *Attorney, Agent, or Firm* — Edell, Shapiro & Finnan, LLC

(57) ABSTRACT

A level shifter includes a low-level adjustment circuit, a comparator circuit, and a high-level adjustment circuit. The low-level adjustment circuit pulls down a level of one between a first input node and a second input node to a first low supply voltage. The comparator outputs a one having higher level between the level of the first input node and a second low supply voltage to a first output node, wherein the second low supply voltage is higher than the first low supply voltage. The high-level adjustment circuit selectively adjusts the level of the first output node according to the level of the first input node and the level of the second input node to generate an output signal.

8 Claims, 7 Drawing Sheets

LEVEL SHIFTER WITH LOW PROPAGATION DELAY

This application claims the benefit of China application Serial No. CN 202210307108.X, filed Mar. 25, 2022, the subject matter of which is incorporated herein by reference.

BACKGROUND OF THE INVENTION

Field of the Invention

The present application relates to a level shifter, and more particularly, to a level shifter capable of rapidly switching a signal level.

Description of the Related Art

An electronic device usually includes several different circuit systems. In some applications, these circuit systems may operate at different voltage levels. To enable these circuit systems to transfer data or signals to one another, a level shifter may be arranged among these circuit systems so as to ensure that levels of signals conform with voltage levels of the circuit systems. In some related techniques, a level shifter performs level shifting by using multiple cross-coupled inverters. However, due to influences of other clamp circuits and operation delay of these inverters, severe propagation delay may be resulted during the level switching process of signals. Thus, such delay occurring during the switching process of signals leads to higher uncertainty in transition edges of the signals.

SUMMARY OF THE INVENTION

In some embodiments, it is an object of the present application to provide a level shifter with low propagation delay so as to improve the issues of the prior art.

In some embodiments, a level shifter includes a low-level adjustment circuit, a first comparator circuit, and a high-level adjustment circuit. The low-level adjustment circuit pulls down a level of one between a first input node and a second input node to a first low supply voltage. The first comparator outputs the one having higher level between the level of the first input node and a second low supply voltage to a first output node, wherein the second low supply voltage is higher than the first low supply voltage. The high-level adjustment circuit selectively adjusts the level of the first output node according to the level of the first input node and the level of the second input node to generate an output signal.

In some embodiments, the level shifter can provide an additional path to rapidly adjust the level of a node, further reducing the delay generated during a level shifting process of a signal. Thus, an output signal generated by the level shifter has fast switching transition edges, further reducing the uncertainty in transition edges of the output signal.

Features, implementations and effects of the present application are described in detail in preferred embodiments with the accompanying drawings below.

BRIEF DESCRIPTION OF THE DRAWINGS

To better describe the technical solution of the embodiments of the present application, drawings involved in the description of the embodiments are introduced below. It is apparent that, the drawings in the description below represent merely some embodiments of the present application, and other drawings apart from these drawings may also be obtained by a person skilled in the art without involving inventive skills.

DETAILED DESCRIPTION OF THE INVENTION

All terms used in the literature have commonly recognized meanings. Definitions of the terms in commonly used dictionaries and examples discussed in the disclosure of the present application are merely exemplary, and are not to be construed as limitations to the scope or the meanings of the present application. Similarly, the present application is not limited to the embodiments enumerated in the description of the application.

The term "coupled" or "connected" used in the literature refers to two or multiple elements being directly and physically or electrically in contact with each other, or indirectly and physically or electrically in contact with each other, and may also refer to two or more elements operating or acting with each other. As given in the literature, the term "circuit" may be a device connected by at least one transistor and/or at least one active element by a predetermined means so as to process signals.

Figure 1:
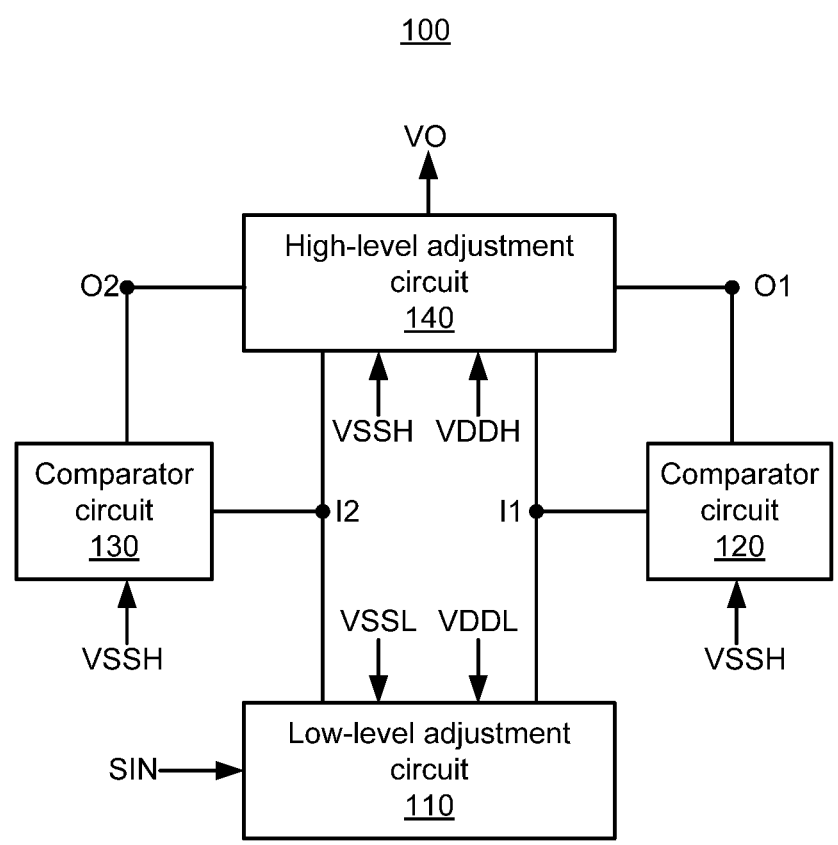
FIG. 1 is a schematic diagram of a level shifter according to some embodiments of the present application.

FIG. 1 shows a schematic diagram of a level shifter 100 according to some embodiments of the present application. The level shifter 100 can be used to shift a level of a signal so as to have the signal adapt to voltage ranges of different power domains. For example, the level shifter 100 may receive an input signal SIN from another digital circuit (not shown), wherein a level range of the input signal SIN may be from a low supply voltage VSSL to a high supply voltage VDDL. The level shifter 100 may generate an output signal VO according to the input signal SIN, wherein a level range of the output signal VO may be from a low supply voltage VSSH to a high supply voltage VDDH, the high supply voltage VDDH is higher than the low supply voltage VSSH, the low supply voltage VSSH may be higher than or equal to the high supply voltage VDDL, and the high supply voltage VDDL is higher than the low supply voltage VSSL.

The level shifter 100 includes a low-level adjustment circuit 110, a comparator 120, a comparator circuit 130 and a high-level adjustment circuit 140. The low-level adjustment circuit 110 selectively pulls down the level of one between an input node I1 and an input node I2 to the high supply voltage VDDL according to the input signal SIN. The comparator 120 outputs the one having a higher level between the level of the input node I1 and the low supply voltage VSSH to an output node O1. The comparator 130 outputs the one having a higher level between the level of the input node I2 and the low supply voltage VSSH to an output node O2. The high-level adjustment circuit 140 selectively adjusts the level of the output node O1 and the level of the output node O2 according to the level of the input node I1 and the level of the input node I2, and generates the output signal VO according to the level of the output node O2.

In this example, the low-level adjustment circuit 110 operates in a first power domain, which is defined by the low supply voltage VSSL and the high supply voltage VDDL. The low-level adjustment circuit 110 may pull the amplitude of the input signal SIN up to the high supply voltage VDDL or down to the low supply voltage VSSL, and accordingly adjust the level of the input node I1 and the level of the input node I2. The high-level adjustment circuit 140 operates in a second power domain, which is defined by the low supply voltage VSSH and the high supply voltage VDDH. The high-level adjustment circuit 140 may further pull up the level of the output node O1 (and the output node O2) to the high supply voltage VDDH or the low supply voltage VSSH according to the level of the input node I1 and the level of the input node I2, and accordingly generate the output signal VO.

As to be described shortly, the comparator circuit 120 can assist in more rapidly pulling down the level of the output node O1 to the low supply voltage VSSH, and the comparator 130 can assist in more rapidly pulling down the level of the output node O2 to the low supply voltage VSSH. As such, the output signal VO is enabled to be rapidly switch to the level of the low supply voltage VSSH during the level switching process, further reducing the transient delay and uncertainty at a falling edge of the output signal VO.

Figure 2:
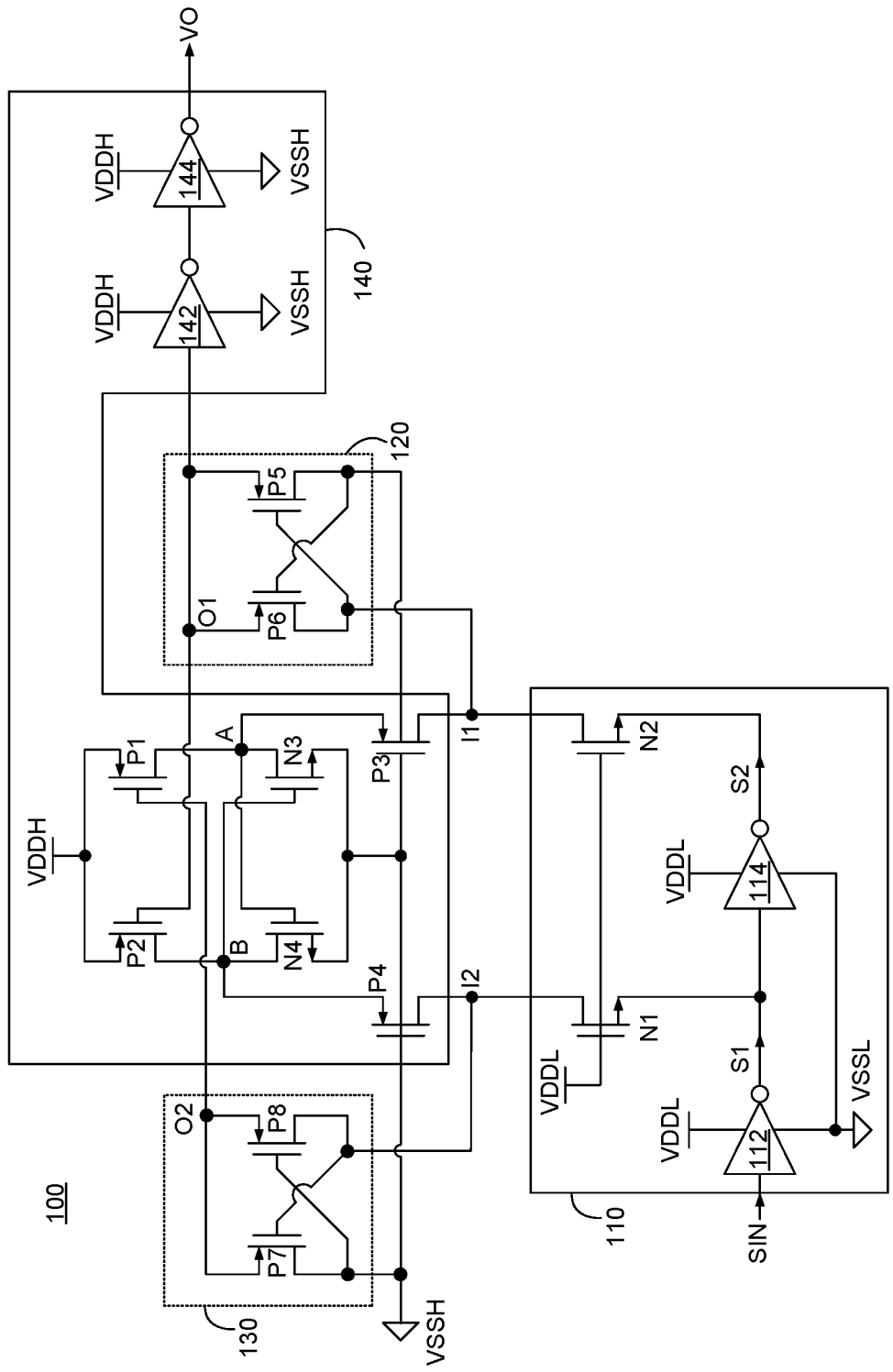
FIG. 2 is a circuit schematic diagram of the level shifter in FIG. 1 according to some embodiments of the present application.

FIG. 2 shows a circuit schematic diagram of the level shifter 100 in FIG. 1 according to some embodiments of the present application. In this example, the low-level adjustment circuit 110 includes an inverter 112, an inverter 114, and transistors N1 and N2. The inverter 112 generates a signal S1 according to the input signal SIN. The inverter 114 generates a signal S2 according to the signal S1. A first terminal (for example, the drain) of the transistor N1 is coupled to the input node I2, a second terminal (for example, the source) of the transistor N1 receives the signal S1, and a control terminal (for example, the gate) of the transistor N1 receives the high supply voltage VDDL. A first terminal of the transistor N2 is coupled to the input node I1, a second terminal of the transistor N2 receives the signal S2, and a control terminal of the transistor N2 receives the high supply voltage VDDL.

With the above configuration, the transistor N1 and the transistor N2 may be biased by the high supply voltage VDDL, the transistor N1 may selectively pull down the level of the input node I2 to the low supply voltage VSSL according to the signal S1, and the transistor N2 may selectively pull down the level of the node I1 to the low supply voltage VSSL according to the signal S2. For example, when the input signal SIN is in a logic value 0, the level of the signal S1 is the high supply voltage VDDL, and the level of the signal S2 is the low supply voltage VSSL. Under these conditions, the transistor N1 is turned off and the transistor N2 is turned on, so as to pull down the level of the input node I1 to the low supply voltage VSSL. Alternatively, when the input signal SIN is in a logic value 1, the level of the signal S1 is the low supply voltage VSSL, and the level of the signal S2 is the high supply voltage VDDL. Under these conditions, the transistor N2 is turned off and the transistor N1 is turned on, so as to pull down the level of the input node I2 to the low supply voltage VSSL.

The high-level adjustment circuit 140 includes multiple transistors P1 to P4, multiple transistors N3 and N4, and multiple inverters 142 and 144. A first terminal (for example, the source) of the transistor P1 receives the high supply voltage VDDH, a second terminal (for example, the drain) of the transistor P1 is coupled to a control node A, and a control terminal (for example, the gate) of the transistor P1 is coupled to the output node O2. The transistor P1 may selectively pull up the level of the control node A to the high supply voltage VDDH according to the level of the output node O2. A first terminal of the transistor P2 receives the high supply voltage VDDH, a second terminal of the transistor P2 is coupled to a control node B, and a control terminal of the transistor P2 is coupled to the output node O1. The transistor P2 may selectively pull up the level of the control node B to the high supply voltage VDDH according to the level of the output node O1. A first terminal of the transistor N3 is coupled to the control node A, a second terminal of the transistor N3 receives the low supply voltage VSSH, and a control terminal of the transistor N3 is coupled to the control node B. The transistor N3 may selectively pull down the level of the control node A to the low supply voltage VSSH according to the level of the control node B. A first terminal of the transistor N4 is coupled to the control node B, a second terminal of the transistor N4 receives the low supply voltage VSSH, and a control terminal of the transistor N4 is coupled to the control node A. The transistor N4 may selectively pull down the level of the control node B to the low supply voltage VSSH according to the level of the control node A. A first terminal of the transistor P3 is coupled to the control node A, a second terminal of the transistor P3 is coupled to the input node I1, and a control terminal of the transistor P3 receives the low supply voltage VSSH. The transistor P3 may be biased by the low supply voltage VSSH, and be selectively turned on according to the level of the control node A so as to adjust the level of the input node I1. A first terminal of the transistor P4 is coupled to the control node B, a second terminal of the transistor P4 is coupled to the input node I2, and a control terminal of the transistor P4 receives the low supply voltage VSSH. The transistor P4 may be biased by the low supply voltage VSSH, and be selectively turned on according to the level of the control node B so as to adjust the level of the input node I2.

The multiple inverters 142 and 144 are powered by the high supply voltage VDDH and the low supply voltage VSSL, and are coupled in series to operate as a buffer, which can generate the output signal VO according to the level of the output node O1.

The comparator circuit 120 includes multiple transistors P5 and P6. A first terminal of the transistor P5 is coupled to the output node O1, a second terminal of the transistor P5 receives the low supply voltage VSSH, and a control terminal of the transistor P5 is coupled to the input node I1. A first terminal of the transistor P6 is coupled to the output node O1, a second terminal of the transistor P6 is coupled to the input node I1, and a control terminal of the transistor P6 receives the low supply voltage VSSH. With the above configuration, the transistor P5 may be selectively turned on according to the level of the input node I1 so as to transmit the low supply voltage VSSH to the output node O1, and the transistor P6 may be selectively turned on according to the level of the input node I1 so as to connect the input node I1 to the output O1. For example, when the low supply voltage VSSH is higher than the level of the input node I1, the transistor P5 is turned on and the transistor P6 is turned off, so as to transmit the low supply voltage VSSH to the output node O1. Alternatively, when the level of the input node I1 is higher than the low supply voltage VSSH, the transistor P6 is turned on and the transistor P5 is turned off, so as to connect the input node I1 to the output node O1.

The comparator circuit 130 includes multiple transistors P7 and P8. A first terminal of the transistor P7 is coupled to the output node O2, a second terminal of the transistor P7 receives the low supply voltage VSSH, and a control terminal of the transistor P7 is coupled to the input node I2. A first terminal of the transistor P8 is coupled to the output node O2, a second terminal of the transistor P8 is coupled to the input node I2, and a control terminal of the transistor P8 receives the low supply voltage VSSH. With the above configuration, the transistor P7 may be selectively turned on according to the level of the input node I2 so as to transmit the low supply voltage VSSH to the output node O2, and the transistor P8 may be selectively turned on according to the level of the input node I2 so as to connect the input node I2 to the output O2. For example, when the low supply voltage VSSH is higher than the level of the input node I2, the transistor P7 is turned on and the transistor P8 is turned off, so as to transmit the low supply voltage VSSH to the output node O2. Alternatively, when the level of the input node I2 is higher than the low supply voltage VSSH, the transistor P8 is turned on and the transistor P7 is turned off, so as to connect the input node I2 to the output node O2.

It is understandable that, the comparator circuit 120 and the comparator circuit 130 are equivalent to high-voltage selection circuits, and the present application is not limited to the above configurations. Various types of comparator circuits capable of outputting higher voltages are encompassed within the scope of the present application.

Figure 3A:
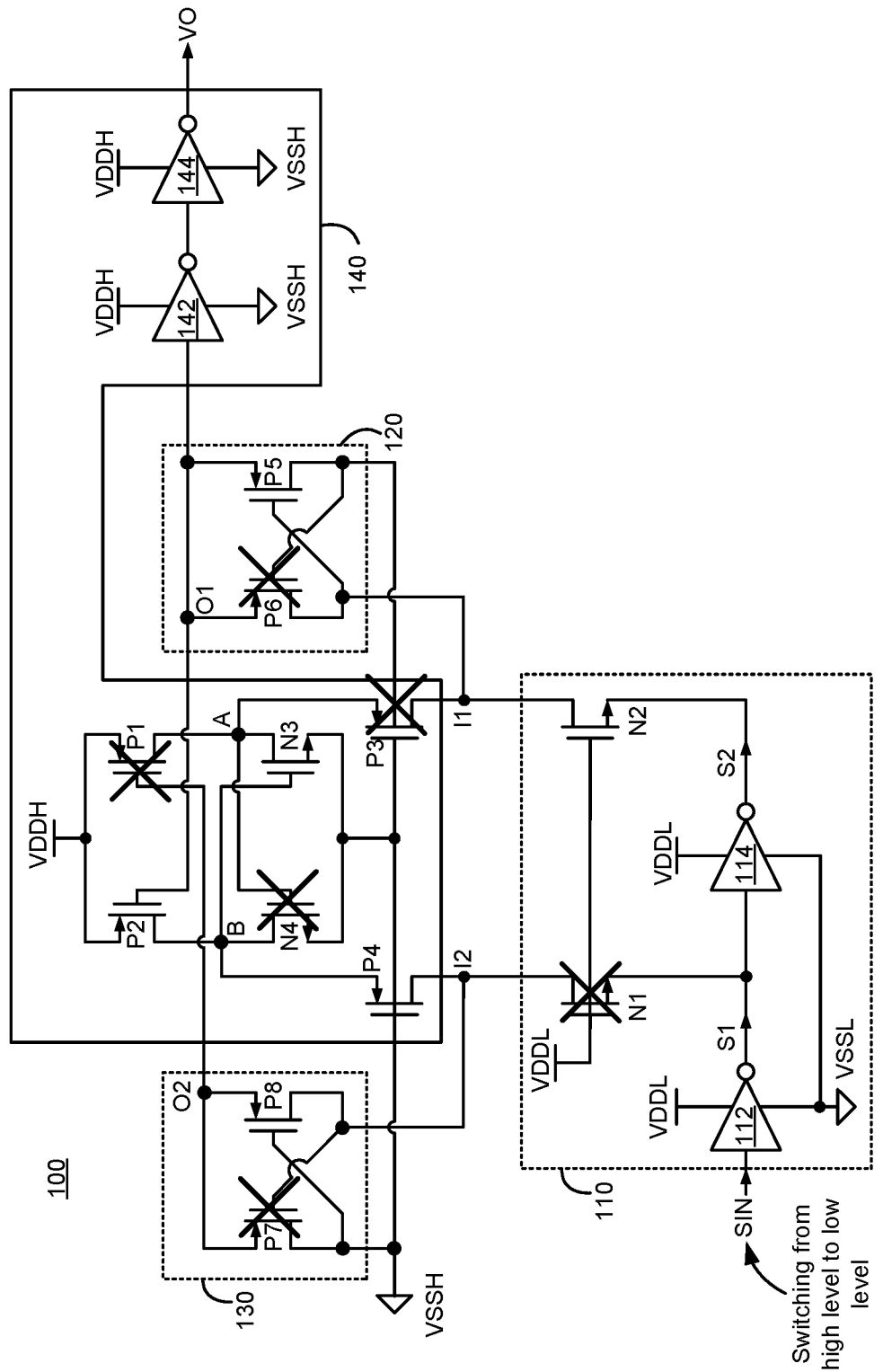
FIG. 3A is an operation schematic diagram of the level shifter in FIG. 2 when an input signal has a low logic value according to some embodiments of the present application.

FIG. 3A shows an operation schematic diagram of the level shifter 100 in FIG. 2 when the input signal SIN has a low logic value according to some embodiments of the present application. In the example in FIG. 3A, when the input signal SIN switches from a high level to a low level (that is, the input signal SIN has a low logic value), the signal S1 has a high level and the signal S2 has a low level. Under these conditions, the transistor N1 is turned off and the transistor N2 is turned on, such that the level of the input node I1 is pulled down to the low supply voltage VSSL. Because the low supply voltage VSSH is higher than the level of the input node I1 (equivalent to the low supply voltage VSSL), the transistor P6 is turned off and the transistor P5 is turned on, so as to transmit the low supply voltage VSSH to the output node O1. As such, the level of the output node O1 is rapidly pulled down to the low supply voltage VSSH so as to generate the output signal VO having a corresponding low level.

Moreover, because the output node O1 is at a low level, the transistor P2 is turned on to pull up the level of the control node B to the high supply voltage VDDH. Under these conditions, the transistor N4 is turned off and the transistor N3 is turned on to pull down the level of the control node A to the low supply voltage VSSL, such that the transistor P3 is turned off and the transistor P4 is turned on to connect the control node B to the input node I2. As such, the level of the input node I2 may be pulled up to the high supply voltage VDDH through the transistor P4 and the transistor P2. Because the level of the input node I2 is higher than the low supply voltage VSSH, the transistor P7 is turned off and the transistor P8 is turned on, so as to connect the input node I2 to the output node O2 and to further turn off the transistor P1.

Figure 3B:
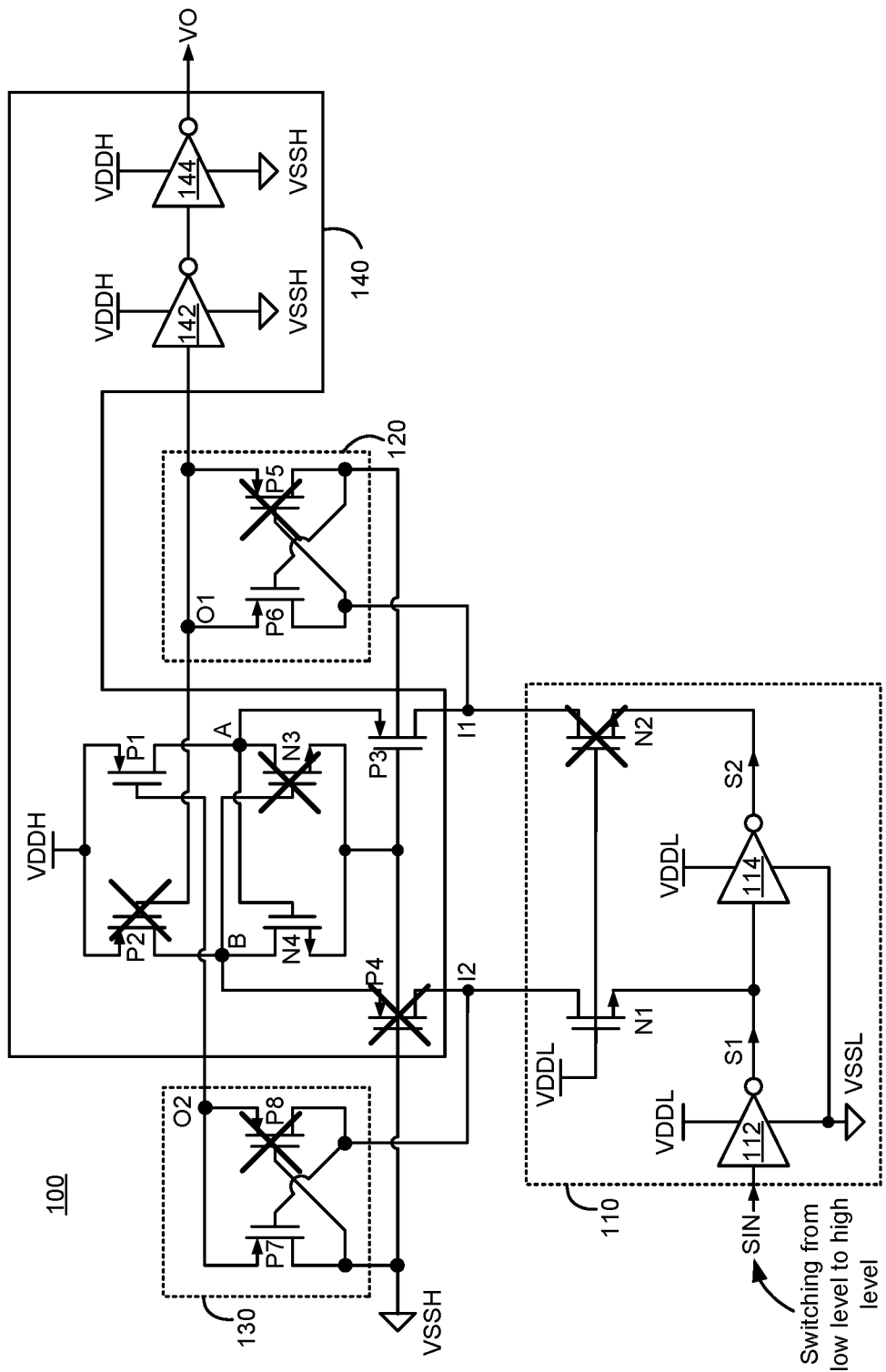
FIG. 3B is an operation schematic diagram of the level shifter in FIG. 2 when an input signal has a high logic value according to some embodiments of the present application.

FIG. 3B shows an operation schematic diagram of the level shifter 100 in FIG. 2 when the input signal SIN has a high logic value according to some embodiments of the present application. In the example in FIG. 3B, when the input signal SIN switches from a low level to a high level (that is, the input signal SIN has a high logic value), the signal S2 has a high level and the signal S1 has a low level. Under these conditions, the transistor N2 is turned off and the transistor N1 is turned on, such that the level of the input node I2 is pulled down to the low supply voltage VSSL. Because the low supply voltage VSSH is higher than the level of the input node I2 (equivalent to the low supply voltage VSSL), the transistor P8 is turned off and the transistor P7 is turned on, so as to transmit the low supply voltage VSSH to the output node O2. As such, the level of the output node O2 is rapidly pulled down to the low supply voltage VSSH.

Moreover, because the output node O2 is at a low level, the transistor P1 is turned on to pull up the level of the control node A to the high supply voltage VDDH. Under these conditions, the transistor N3 is turned off and the transistor N4 is turned on to pull down the level of the control node B to the low supply voltage VSSH, such that the transistor P4 is turned off and the transistor P3 is turned on to connect the control node A to the input node I1. As such, the level of the input node I1 may be pulled up to the high supply voltage VDDH through the transistor P3 and the transistor P1. Because the level of the input node I1 is higher than the low supply voltage VSSH, the transistor P5 is turned off and the transistor P6 is turned on, so as to connect the input node I1 to the output node O1 and to further turn off the transistor P2. As such, the level of the input node I1 is rapidly pulled up to the high supply voltage VDDH to generate the output signal VO having the corresponding high level.

With the description on the basis of FIG. 3A and FIG. 3B, it is understandable that, when the input signal SIN is switched to a low level, the comparator circuit 120 is capable of rapidly pulling down the level of the output node O1 to the low supply voltage VSSH. As such, when the input signal SIN switches from a high level to a low level, the output signal VO can have low-delay level switching so as to have a fast falling transition edge (that is, a falling edge). In contrast, when the input signal SIN switches to a high level, the level of the input node I1 is pulled up with the collaboration of the comparator circuit 130 and the high-level adjustment circuit 140, further pulling up the level of the output signal VO to the high supply voltage VDDH. In some embodiments, in actual applications, the transient time of the output signal VO switching from a low level to a high level may be longer than a transient time of the output signal VO switching from a high level to a low level.

Figure 4A:
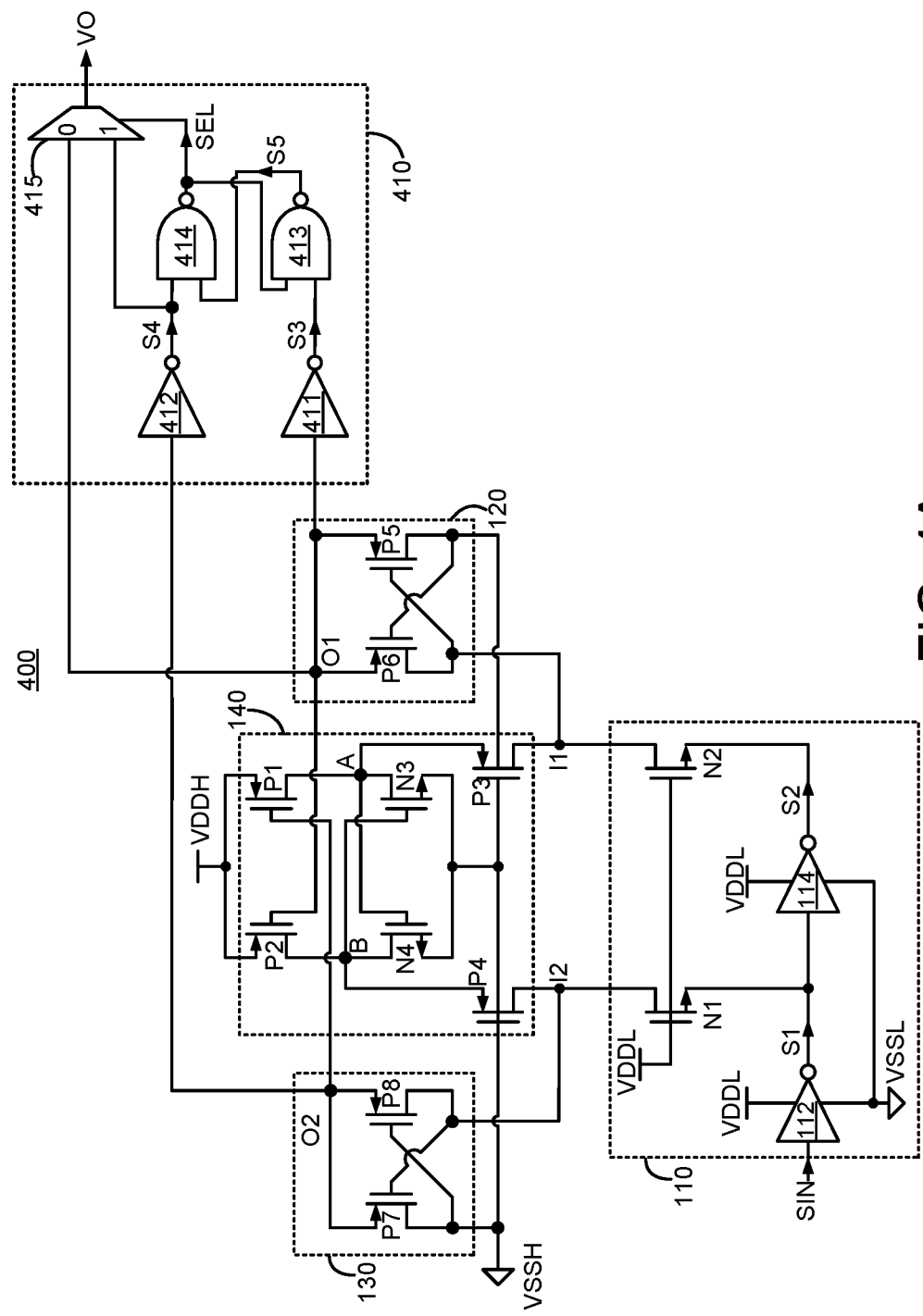
FIG. 4A is a schematic diagram of a level shifter according to some embodiments of the present application.

FIG. 4A shows a schematic diagram of a level shifter 400 according to some embodiments of the present application. Compared to FIG. 2, in this example, the level shifter 400 further includes a selection circuit 410, the high-level adjustment circuit 140 does not include the inverters 142 and 144, and the output signal VO is generated by the selection circuit 410. As described above, in the foregoing example, the transient time of the output signal VO switching from a low level to a high level may be longer than a transient time of the output signal VO switching from a high level to a low level. To further ensure that the output signal VO has a fast rising transition edge (that is, a rising edge), the selection circuit 140 may be used to further generate the output signal VO according to the level of the output node O2.

More specifically, the high-level adjustment circuit 410 selects a corresponding node from the output node O1 and the output node N2 according to the level of the output node O1 and the level of the output node O2, and generates the output signal VO according to the corresponding node. For example, the selection circuit 410 includes an inverter 411, an inverter 412, a logic gate 413, a logic gate 414 and a multiplexer 415. The inverter 411 generates a signal S3 according to the level of the output node O1. The inverter 412 generates a signal S4 according to the level of the output node O2. The logic gate 413 generates a signal S5 according to the signal S3 and a selection signal SEL. The logic gate 414 generates the selection signal SEL according to the signal S4 and the signal S5. In this example, the logic gate 413 and the logic gate 414 may be, for example but not limited to, NAND gates, and may operate as SR flip-flops. The multiplexer 415 outputs the signal S4 as the output signal VO according to the selection signal SEL, or generates the output signal VO according to the level of the output node O1.

Figure 4B:
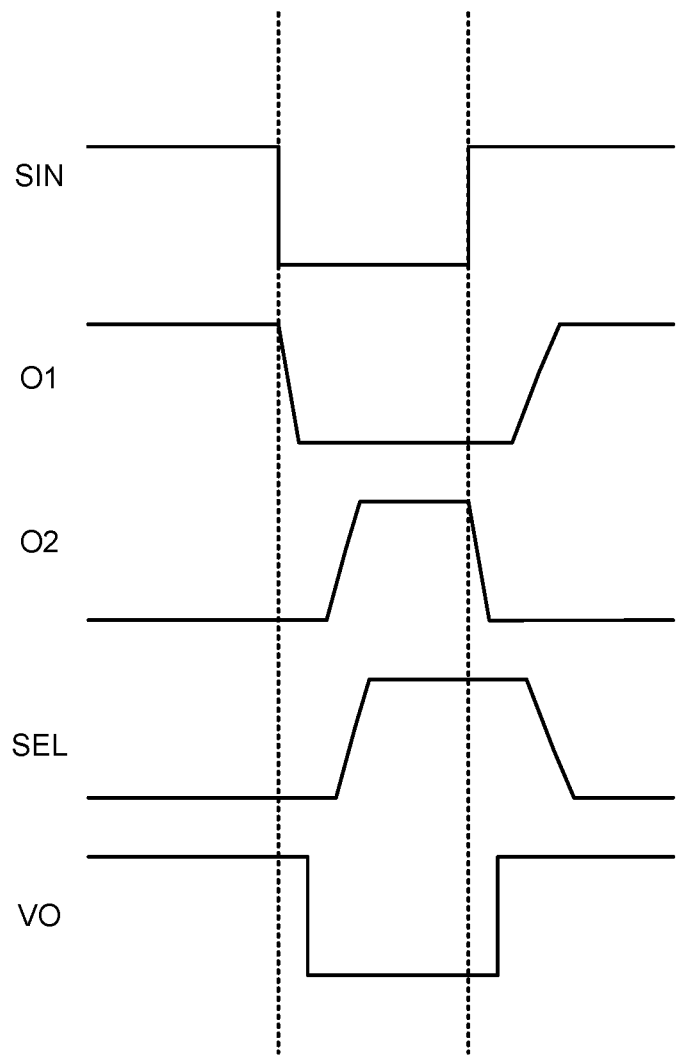
FIG. 4B is a waveform diagram of related signals in FIG. 4 according to some embodiments of the present application.

FIG. 4B shows a waveform diagram of related signals in FIG. 4 according to some embodiments of the present application. When the input signal SIN has a high level, the output node O1 has a high level, and the output node O2 has a low level. Under these conditions, the selection signal SEL has a low level, and so the multiplexer 415 generates the output signal VO according to the level of the output node O1. When the input signal SIN switches from a high level to a low level, the level of the output node O1 is rapidly pulled down to the low supply voltage VSSL through the comparator circuit 120, and so the multiplexer 415 can generate the corresponding output signal VO according to the level of the output node O1. Next, when the level of the output node O2 is pulled up to the high supply voltage VDDH (referring to FIG. 3A) by the collaboration of the high-level adjustment circuit 140 and the comparator circuit 130, the selection signal SEL has a high level. Under these conditions, the multiplexer 415 outputs the signal S4 as the output signal VO. When the input signal SIN switches from a low level to a high level, the level of the output node O2 may be rapidly pulled down to the low supply voltage VSSL (referring to FIG. 3B) through the comparator 130, so that the signal S4 may have a fast rising transition edge. Thus, the multiplexer 415 outputs the signal S4 as the output signal VO.

Equivalently speaking, the selection circuit 410 may select a corresponding node from the output node O1 and the output node O2 according to the level of the output node O1 and the level of the output node O2, wherein when the level of the corresponding node switches from a high level (for example, the high supply voltage VDDH) to a low level (for example, the low supply voltage VSSL), the selection circuit 140 generates the output signal VO according to the level of this corresponding node. Thus, it is ensured that the selection circuit 410 generates the output signal VO according to a fast falling level, further reducing the delay time in level switching of the output signal VO.

In general, an operating speed of a circuit gradually slows down as the utilization time of a circuit gets longer. Because the selection circuit 410 is capable of selectively generating the output signal VO through the output node O1 of the comparison circuit 120 or through the output node O2 of the comparison circuit 130, and there are not a large number of transistors used on a route for pulling down the output node O1 or the output node O2, the impact of the utilization time is lower. In other words, the durability of the level shifter 400 is further improved with the selection circuit 410.

In the above embodiments, the multiple transistors N1 to N4 are N-type transistors, and the multiple transistor P1 to P8 are P-type transistors. The transistors above can be implemented by metal oxide semiconductor field-effect transistors (MOSFET); however, the present application is not limited to the example above. Various types or conductive types capable of implementing similar operations are encompassed within the scope of the present application.

Figure 5:
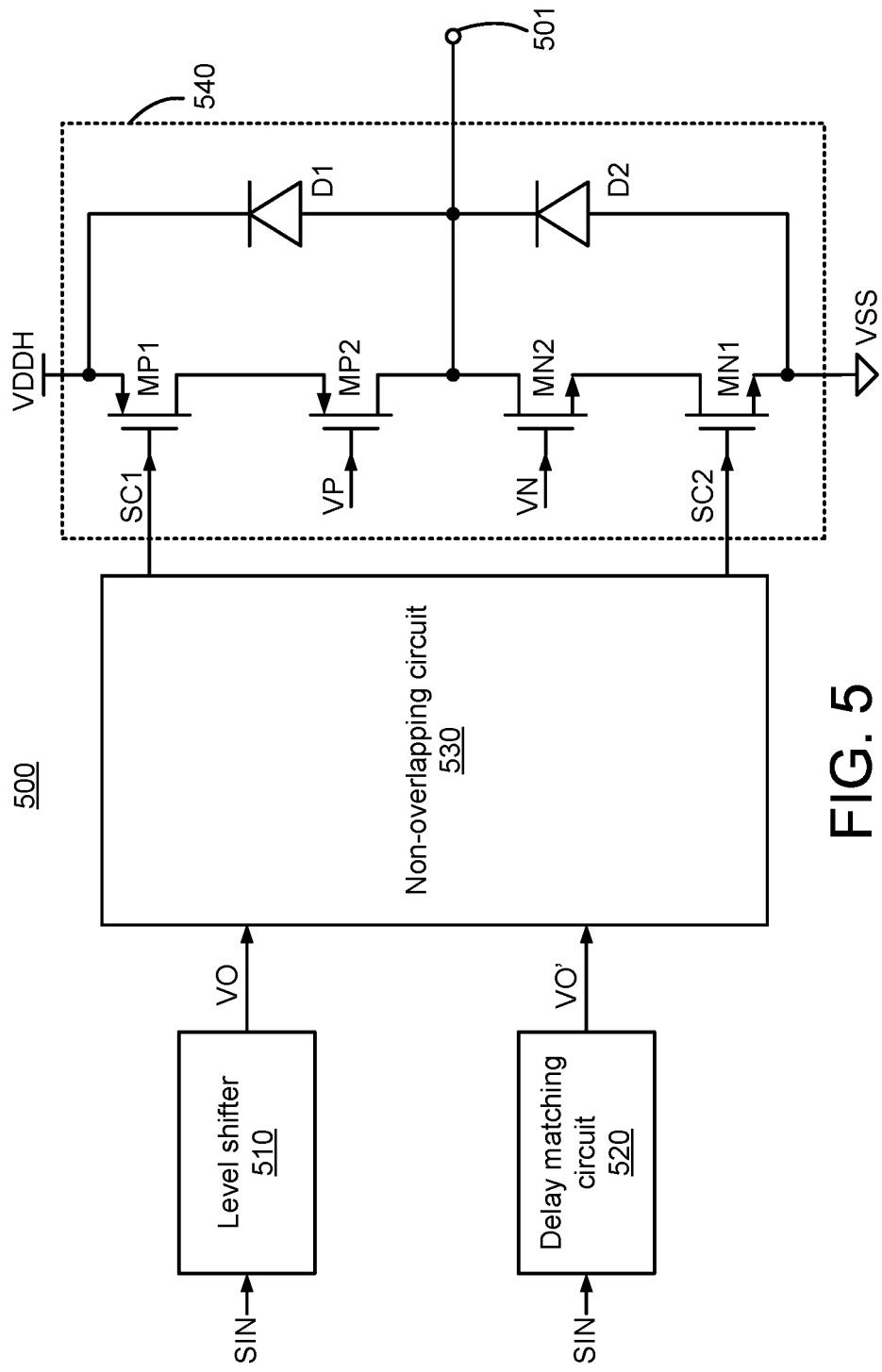
FIG. 5 is a schematic diagram of an input/output driver according to some embodiments of the present application

FIG. 5 shows a schematic diagram of an input/output driver 500 according to some embodiments of the present application. The input/output driver 500 includes a level shifter 510, a delay matching circuit 520, a non-overlapping circuit 530 and a protection circuit 540. The level shifter 510 may be implemented by the level shifter 100 in FIG. 1 or FIG. 2 or the level shifter 400 in FIG. 4. The level shifter 510 may generate the output signal VO according to the input signal VIN. The delay matching circuit 520 may generate an output signal VO' according to the input signal SIN, wherein the delay introduced by the delay matching circuit 520 to the input signal SIN is equal (or close) to the delay time introduced by the level shifter 510 to the input signal SIN. In other words, the non-overlapping circuit 530 receives the output signal VO and the output signal VO' at a same timing (or close timings). In some embodiments, the delay matching circuit 520 may have, for example but not limited to, a circuit structure similar to that of the level shifter 510 (but operating in a different power domain), so as to achieve a similar delay time. The non-overlapping circuit 530 generates a control signal SC1 according to the output signal VO, and generates a control signal SC2 according to the output signal VO'. The non-overlapping circuit 530 may delay the output signal VO to generate the control signal SC1, and delay the output signal VO' to generate the control signal SC2, wherein the control signal SC1 and the control signal SC2 have a non-overlapping period in between (for example, a transition edge of the control signal SC1 and a transition edge of the control signal SC2 are spaced by a time gap in between).

The protection circuit 540 includes multiple transistors MP1, MP2, MN1 and MN2, and multiple diodes D1 and D2. The multiple transistors MP1, MP2, MN1 and MN2 and the multiple diodes D1 and D2 can operate as a voltage protection circuit so as to provide an input/output pad 501 with fundamental voltage protection. The transistor MP1 receives a high supply voltage VDDH, and is selectively turned on according to the control signal SC1. The transistor MP2 is controlled by a clamp signal VP, and is coupled to the input/output pad 501. The transistor MN2 is controlled by a clamp signal VN, and is coupled to the input/output pad 501. The transistor MN1 receives a lower supply voltage VSS, and is selectively turned on according to the control signal SC2.

By setting the non-overlapping period between the control signal SC1 and the control signal SC2, it is ensured that the transistor MP1 and the transistor MN1 are not simultaneously turned on, further preventing the protection circuit 540 from generating a short-circuit current. As described previously, in some related techniques, a level shifter contains operation delay such that higher uncertainty is generated at transition edges of a signal. If a level shifter of these techniques is used to generate the output signal VO, the transition edge of the control signal SC1 generated by the non-overlapping circuit 530 also contains uncertainty (that is, a transition timing of the control signal SC1 cannot be accurately controlled). As a result, the non-overlapping period between the control signal SC1 and the control signal SC2 may get too long, and this degrades the performance of the output driver 500. Or, in some extreme situations, the transistor MP1 and the transistor MN1 may be simultaneously turned on according to the control signal SC1 and the control signal SC2, and a short-circuit current may be erroneously generated. Compared to the above techniques, using the level shifter 100 or the level shifter 400 according to some embodiments of the present invention, the non-overlapping circuit 530 is capable of accurately controlling a transition timing of the control signal SC1, so as to ensure that a certain non-overlapping period is present between the control signal SC1 and the control signal SC2, and is also capable of controlling the non-overlapping period to have a shorter time length, so as to improve the performance of the input/output driver 500.

In conclusion, the level shifter according to some embodiments of the present invention can provide an additional path to rapidly adjust the level of a node, further reducing the delay generated during the level shifting process of a signal. Thus, an output signal generated by the level shifter has fast switching transition edges, further reducing the uncertainty in transition edges of the output signal.

While the present application has been described by way of example and in terms of the preferred embodiments, it is to be understood that the present application is not limited thereto. Various modifications made be made to the technical features of the present application by a person skilled in the art on the basis of the explicit or implicitly disclosures of the present application. The scope of the appended claims of the present application therefore should be accorded with the broadest interpretation so as to encompass all such modifications.

What is claimed is:

1. A level shifter, comprising:
    a low-level adjustment circuit, selectively pulling down a level of one between a first input node and a second input node to a first low supply voltage according to an input signal;
    a first comparator, outputting a one having higher level between the level of the first input node and a second low supply voltage to a first output node, wherein the second low supply voltage is higher than the first low supply voltage; and
    a high-level adjustment circuit, selectively adjusting the level of the first output node according to the level of the first input node and the level of the second input node to generate an output signal,
    wherein the high-level adjustment circuit comprises:
    a first transistor, selectively pulling up a level of a first control node to a high supply voltage according to a level of a second output node;
    a second transistor, selectively pulling up a level of a second control node to the high supply voltage according to the level of the first output node;
    a third transistor, selectively pulling down the level of the first control node to the second low supply voltage according to the level of the second control node;
    a fourth transistor, selectively pulling down the level of the second control node to the second low supply voltage according to the level of the first control node;
    a fifth transistor, biased by the second low supply voltage, and selectively turned on according to the level of the first control node so as to adjust the level of the first input node; and
    a sixth transistor, biased by the second low supply voltage, and selectively turned on according to the level of the second control node so as to adjust the level of the second input node.

2. The level shifter according to claim 1, wherein the low-level adjustment circuit operates in a first power domain, the high-level adjustment circuit operates in a second power domain, the first power domain is defined by the first low supply voltage and a first high supply voltage, the second power domain is defined by the second low supply voltage and a second high supply voltage, and the second high supply voltage is higher than the first high supply voltage.

3. The level shifter according to claim 1, wherein the low-level adjustment circuit comprises:
    a first inverter, generating a first signal according to the input signal;
    a second inverter, generating a second signal according to the first signal;
    a first transistor, biased by a high supply voltage, and selectively pulling down the level of the second input node to the first low supply voltage according to the first signal; and
    a second transistor, biased by the high supply voltage, and selectively pulling down the level of the first input node to the first low supply voltage according to the second signal.

4. The level shifter according to claim 1, wherein when the input signal switches from a first level to a second level, the first comparator circuit assists in more rapidly pulling down the level of the first output node to the second low supply voltage, and the first level is higher than the second level.

5. A level shifter, comprising:
    a low-level adjustment circuit, selectively pulling down a level of one between a first input node and a second input node to a first low supply voltage according to an input signal;
    a first comparator, outputting a one having higher level between the level of the first input node and a second low supply voltage to a first output node, wherein the second low supply voltage is higher than the first low supply voltage; and
    a high-level adjustment circuit, selectively adjusting the level of the first output node according to the level of the first input node and the level of the second input node to generate an output signal,
    wherein the first comparator circuit comprises:
    a first transistor, selectively turned on according to the level of the first input node to transmit the second low supply voltage to the first output node; and
    a second transistor, selectively turned on according to the level of the first input node to connect the first input node to the first output node.

6. A level shifter, comprising:
    a low-level adjustment circuit, selectively pulling down a level of one between a first input node and a second input node to a first low supply voltage according to an input signal;
    a first comparator, outputting a one having higher level between the level of the first input node and a second low supply voltage to a first output node, wherein the second low supply voltage is higher than the first low supply voltage;
    a high-level adjustment circuit, selectively adjusting the level of the first output node according to the level of the first input node and the level of the second input node to generate an output signal;

a second comparator circuit, outputting a one having higher level between the level of the second input node and the second low supply voltage to a second output node, wherein the high-level adjustment circuit further selectively adjusts the level of the second output node according to the level of the first input node and the level of the second input node, and a selection circuit, selecting a corresponding node from the first output node and the second output node according to the level of the first output node and the level of the second output node, and generating the output signal according to a level of the corresponding node.

7. The level shifter according to claim 6, wherein when the level of the corresponding node switches from a first level to a second level, the selection circuit generates the output signal according to the level of the corresponding node, and the first level is higher than the second level.

8. The level shifter according to claim 6, wherein the selection circuit comprises:
- a first inverter, generating a first signal according to the level of the first output node;
- a second inverter, generating a second signal according to the level of the second output node;
- a first logic gate, generating a third signal according to the first signal and a selection signal;
- a second logic gate, generating the selection signal according to the second signal and the third signal; and
- a multiplexer, outputting the second signal as the output signal according to the selection signal, or generating the output signal according to the level of the first output node.

* * * * *